United States Patent
Maijala et al.

(10) Patent No.: US 9,629,255 B2
(45) Date of Patent: Apr. 18, 2017

(54) METHOD AND ARRANGEMENT FOR ATTACHING A CHIP TO A PRINTED CONDUCTIVE SURFACE

(75) Inventors: Juha Maijala, Kellokoski (FI); Petri Sirviö, Imatra (FI)

(73) Assignee: Stora Enso OYJ, Helsinki (FI)

(*) Notice: Subject to any disclaimer, the term of this patent is extended or adjusted under 35 U.S.C. 154(b) by 142 days.

(21) Appl. No.: 13/878,864

(22) PCT Filed: Oct. 14, 2010

(86) PCT No.: PCT/FI2010/050797
§ 371 (c)(1),
(2), (4) Date: Jun. 14, 2013

(87) PCT Pub. No.: WO2012/049352
PCT Pub. Date: Apr. 19, 2012

(65) Prior Publication Data
US 2013/0255079 A1   Oct. 3, 2013

(51) Int. Cl.
*H05K 3/30* (2006.01)
*B23K 1/00* (2006.01)
(Continued)

(52) U.S. Cl.
CPC ............ *H05K 3/30* (2013.01); *B23K 1/0016* (2013.01); *H05K 3/323* (2013.01); *H05K 3/3494* (2013.01); *H05K 13/0465* (2013.01); *H05K 3/3436* (2013.01); *Y10T 29/4913* (2015.01); *Y10T 29/53178* (2015.01)

(58) Field of Classification Search
USPC ......... 29/739, 740, 742, 743, 833, 834, 836; 294/64.1; 414/737, 751.1, 752.1
See application file for complete search history.

(56) References Cited

U.S. PATENT DOCUMENTS 3,680,196 A   8/1972   Leinkram
3,680,199 A   8/1972   Johnson
(Continued)

FOREIGN PATENT DOCUMENTS

CN   101013674 A   8/2007
CN   101346735 A   1/2009
(Continued)

OTHER PUBLICATIONS

Japanese Notification of Rejection for Japanese Application No. 2013-533247 dated Feb. 18, 2016.
(Continued)

*Primary Examiner* — Paul D Kim
(74) *Attorney, Agent, or Firm* — Patterson Thuente Pedersen, P.A.

(57) ABSTRACT

A chip attached to and electrically connected with a printed conductive surface, whereby the chip is heated to a temperature, which is lower than what the chip can stand without being damaged by the heat, the heated chip is then pressed against the printed conductive surface with a pressing force, whereby a combination of said temperature and said pressing force is sufficient to at least partly melt the material of at least one of the printed conductive surface, the contact point on the chip, or both, thereby attaching and electrically connecting the chip to the printed conductive surface.

17 Claims, 5 Drawing Sheets

(51) Int. Cl.
  H05K 13/04 (2006.01)
  H05K 3/32 (2006.01)
  H05K 3/34 (2006.01)

(56) References Cited

U.S. PATENT DOCUMENTS

| | | | |
|---|---|---|---|
| 5,609,292 | A | 3/1997 | Kohn |
| 5,795,818 | A | 8/1998 | Marrs |
| 6,016,949 | A | 1/2000 | Slesinger |
| 6,108,210 | A | 8/2000 | Chung |
| 6,466,758 | B2 * | 10/2002 | Chigono ............... G03G 15/09 399/149 |
| 7,344,818 | B2 * | 3/2008 | Ohmura ............... C08J 3/215 430/137.14 |
| 2006/0037997 | A1 | 2/2006 | Higashi et al. |
| 2006/0051895 | A1 | 3/2006 | Abe et al. |
| 2007/0141750 | A1 | 6/2007 | Iwasaki et al. |
| 2007/0141760 | A1 | 6/2007 | Ferguson et al. |
| 2007/0183184 | A1 | 8/2007 | Nakamura et al. |
| 2009/0020870 | A1 | 1/2009 | Watanabe et al. |

FOREIGN PATENT DOCUMENTS

| | | | | |
|---|---|---|---|---|
| JP | 05021949 | A * | 1/1993 | .............. H05K 3/34 |
| JP | H1050766 | A | 2/1998 | |
| JP | 2003197683 | A | 7/2003 | |
| JP | 2005-161341 | | 6/2005 | |
| JP | 2005259925 | A | 9/2005 | |
| JP | 2006-222170 | A | 8/2006 | |
| JP | 2006222170 | A | 8/2006 | |
| WO | WO 2009/135985 | A1 | 11/2009 | |
| WO | WO 2010/053454 | A1 | 5/2010 | |

OTHER PUBLICATIONS

Japanese First Office Action for Japanese Application No. 201080069606.0 dated Jun. 12, 2015.

Japanese Second Office Action for Japanese Application No. 201080069606.0 dated Feb. 14, 2016.

* cited by examiner

METHOD AND ARRANGEMENT FOR ATTACHING A CHIP TO A PRINTED CONDUCTIVE SURFACE

PRIORITY CLAIM

The present application is a National Phase entry of PCT Application No. PCT/FI2010/050797, filed Oct. 14, 2010, the disclosure of which is hereby incorporated by reference in its entirety.

FIELD OF THE INVENTION

The present invention relates generally to the technology of connecting an integrated circuit component, also known as a chip, to a surface that comprises conductive patterns. Especially the present invention concerns a case in which said conductive patterns are produced by printing.

BACKGROUND OF THE INVENTION

Printed electronics appear to hold a promise for enabling cost-effective integration of electronic functionality to a large variety of consumer products. Here it should be noted that even if a traditional, epoxy- or polyester based circuit board is often referred to as a printed circuit board (PCB), it does not fulfil the actual definition of printed electronics. In a PCB the use of (silk screen) printing is limited to producing the etch-resistant ink patterns prior to the etching of unwanted copper, as well as to producing visible markings on the surface of an otherwise completed board. True printed electronics mean that conductive, semiconductive and possibly other patterns that constitute actual functional elements of the electronic circuit are formed on a substrate in a printing process, i.e. printed on the substrate.

At the time of writing this description, the dimensions of typical printed electronics are macroscopic, at least compared to the micro- or nanometre scale line widths and other structures encountered in integrated circuits. This means that implementing complex functionalities with printed electronics requires using a relatively large surface area and/or augmenting the actual printed electronics with integrated circuit components or chips. Also the longer designation "semiconductor chip" can be used, but it should be noted that the base of a chip is not always made of semiconductor material: also e.g. glass-, sapphire-, and steel based chips are known, as well as chips printed with semiconductive polymers onto an isolating polymer base. If chips are to be used, there arises the natural need to attach and connect a chip to the printed electronics. In this description the term to attach and its derivatives mean attaching physically, i.e. keeping from coming loose, while the term to connect and its derivatives mean producing an electrically conductive connection. It should be noted, though, that these terms are not mutually exclusive, but a strong enough method like e.g. soldering may be used to simultaneously attach and connect.

FIG. 1 illustrates a known method for attaching and connecting a chip 101 to printed electronics, of which there are shown the conductive areas 102 and 103 that have been printed on a substrate 104. As an example, we may assume that the substrate 104 is paper or cardboard, and the conductive areas 102 and 103 are pieces of metallic foil (or more generally: areas covered with an essentially metallic compound). On the surface of the chip 101 are solder bumps 105 and 106, and corresponding patches of solder flux 107 and 108 have been spread on the conductive areas 102 and 103. The flux could also have been spread on the solder bumps 105 and 106, or provided in the material of the solder bumps. A drop of glue 109 has been applied to that surface of the chip 101 that faces the substrate 104. The glue helps to keep the chip immobilized at the desired location during the time when sufficient heat is applied to cause at least partial melting of the solder bumps. The flux helps to control the flowing of the melted solder. After cooling, the chip remains attached to the substrate, with electric connections established at the locations where the melting solder formed a bond with the appropriate parts of the conductive areas.

A disadvantage of the prior art method illustrated in FIG. 1 is that it is relatively slow. It is not uncommon that 10 to 15 seconds are needed to attach and connect a single chip. This may prove way too slow for example for large-scale manufacturing of cardboard-made consumer packages for food supplies.

SUMMARY OF THE INVENTION

An advantageous feature of embodiments of the present invention is the provision of a method and an arrangement for attaching and connecting a chip to a printed conductive surface quickly, smoothly and reliably.

The objectives of the present invention are achieved by using a material with particular melting characteristics to produce at least a part of the printed conductive surface, and by bringing the necessary heat to the bonding phase together with the chip.

According to an aspect of the present invention, it is possible to manufacture at least a part of a printed conductive surface, to which a chip should be attached, of a material that has a melting point at a temperature that is lower than what the chip can stand without being damaged. Thus it is not necessary to apply other heat to the attaching and connecting process than what a heated chip brings with it. Melting may take place at the printed conductive surface, at a solder bump or other contact area of the chip, or both. The melting may be assisted by pressing the chip against the printed conductive surface with a suitable force.

A particular class of embodiments of the present invention involves using a steel- or other metal based chip, which can stand relatively a large strain. Consequently a relatively large force can be used to press the chip against the printed conductive surface, so that in the combination of temperature and pressing force the latter has a significant role in causing the melting at the desired locations.

Another particular class of embodiments of the present invention involves using a chip where the base is solely made of silicon or other crystalline matter. Crystalline substances of this kind break relatively easily under strain, which means that only a relatively light force can be used to press the chip against the printed conductive surface. Considering the combination of temperature and pressing force, in this class of embodiments the melting is essentially exclusively caused by the former.

One class of embodiments of the present invention involves using a layer of anisotropically conductive glue on the printed conductive surface. Anisotropically conductive glue is initially not electrically conductive to any significant extent. Locally applying heat will cause conductive particles in the glue to melt and form a conductive path through the glue at a particular location.

The novel features which are considered as characteristic of the present invention are set forth in particular in the appended claims. The invention itself, however, both as to its construction and its method of operation, together with additional objects and advantages thereof, will be best understood from the following description of specific embodiments when read in connection with the accompanying drawings.

The exemplary embodiments of the present invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

DETAILED DESCRIPTION OF EMBODIMENTS OF THE INVENTION

Figure 1:
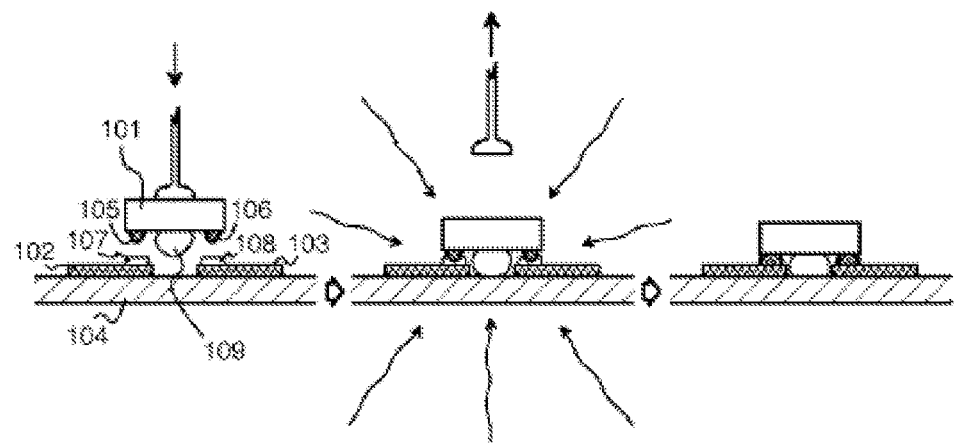
FIG. 1 illustrates a prior art method.

An important application of printed electronics is the provision of conductive surfaces on heat-sensitive substrates like paper and cardboard, which may also comprise polymer and other layers. Methods like those disclosed in patent application number PCT/FI2008/050256, published as WO2009/135985, allow making the conductive surfaces of metallic compounds that are—or resemble—so-called low temperature solders. A non-limiting example list of such metallic compounds includes (indicated percentages are weight percentages):

tin/silver (3.43%)/copper (0.83%)
tin/silver (2-2.5%)/copper (0.8%)/antimony (0.5-0.6%)
tin/silver (3.5%)/bismuth (3.0%)
tin/zink (10%)
tin/bismuth (58%)
tin/indium (52%)
bismuth (53-76%)/tin (22-35%)/indium (2-12%).

It is important to note that many of these metallic compounds have their melting point at a temperature that is lower than what a chip can stand. At room pressure, the first four listed examples melt between 180 and 220 degrees centigrade, while the three last-mentioned may melt at significantly lower temperatures, even below 100 degrees centigrade (the allow mentioned last in the list may have a melting point at 75 degrees centigrade). Simultaneously the melting of a metallic compound may depend on pressure. In general increasing pressure may assist phenomena related to melting and attachment of components to each other. The chip can be heated to a first temperature, and the heated chip can be pressed against the printed conductive surface with a first pressing force, so that the combination of the first temperature and the first pressing force is sufficient to at least partly melt the material of either the printed conductive surface, or a contact point on the chip, or both. The localization of melting and other phenomena related to melting and attachment of components to each other, and the behaviour of molten and/or nearly molten material can be further controlled through the controlled application of flux.

Figure 2:
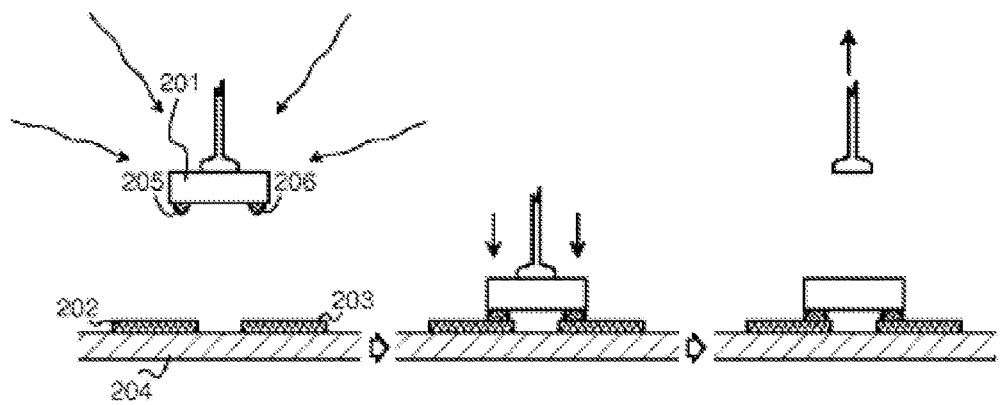
FIG. 2 illustrates attaching and connecting a chip according to an embodiment of the present invention.

FIG. 2 illustrates an example, in which a substrate 204 comprises one or more printed conductive surfaces, of which the upper surface with patterns 202 and 203 is shown in FIG. 2. In order to attach and connect a chip 201 to the printed conductive surface, the chip 201 is heated to a first temperature as shown on the left in FIG. 2. The chip should be workable after connecting, which leads to the natural consequence that said first temperature must be lower than what the chip can stand without being damaged by the heat. The heated chip is pressed against the printed conductive surface with a first pressing force, as illustrated in the middle part of FIG. 2. The combination of the first temperature and the first pressing force is sufficient to at least partly melt the material of either the patterns 202 and 203 of printed conductive surface, or the contact points 205 and 206 on the chip, or both. In addition to melting, also other phenomena related to melting and attachment can take place. As a result, the chip becomes both attached and connected to the printed conductive surface, as illustrated on the right in FIG. 2.

As a first example, we may consider a case in which the chip 201 comprises a metal base. At the time of writing this description, Kovio Inc., 233 S. Hillview Dr., Milpitas, Calif., USA, provides chips where semiconductor parts made of printed silicon reside on a stainless steel base. Metal-based chips are available from other manufacturers as well, and other metals than stainless steel can be used as the base. A metal-base chip may stand temperatures up to 400 degrees centigrade, and the metal base has also excellent mechanical strength, meaning that it can stand a relatively high strain. The last-mentioned characteristic allows pressing a heated metal-base chip against a printed conductive surface with a pressing force that creates a pressure between 1 and 10 MPa (megapascals), calculated by dividing the pressing force by the surface area of the chip. Although metal-based chips allow using a relatively large pressing force, they do not necessarily require it if the process is otherwise made such that a smaller force is enough. The pressure used with metal-based chips could be 0.1 MPa or even less.

The surface pressure experienced by the printed conductive surface is highest at those almost point-like areas where the contact points 205 and 206 touch the patterns 202 and 203 respectively. This high local pressure, together with the heat conducted to the same regions from the body of the chip 201, causes localized phenomena related to melting and attachment that produces an essentially solder-type joint at each contact point.

The point-like nature of the heat conduction and surface pressure application at the contact points ensures that most of the patterns 202 and 203 remain not melted, which in turn means that the local topology of the contact area remains well organized and does not become messy. This is advantageous, because difficultly controlled large-scale melting of the material of the patterns 202 and 203 could easily create short circuits between parts of the resulting electric circuit that must remain isolated from each other. Especially if the printed conductive surface is not exactly horizontal at the moment of attaching and connecting the chip, and/or if the state of movement of the mechanical system changes causing acceleration forces, large-scale melting of the patterns 202 and 203 could also cause significant portions of the molten conductive material to flow out of its intended position on the surface of the substrate 204.

Additionally the point-like phenomena related to melting and attachment at the contact points means that only a relatively small amount of heat needs to be conducted and/or radiated away from the melting zone before the molten material solidifies again. This in turn means that the resulting solder joint not only connects but also attaches the chip in place relatively quickly. The pace at which solidifying occurs can be affected by actively controlling an ambient temperature at the location of pressing the heated chip against the printed conductive surface. For example, there may be a cooled or otherwise temperature-controlled support below the substrate 204, which quickly absorbs heat by conduction through the patterns 202 and 203 and the substrate 204. Such a support may take e.g. the form of a roll or a planar support. Another exemplary way of actively controlling an ambient temperature is to deliver cooled gas to an area surrounding or adjacent to the location of pressing the heated chip against the printed conductive surface.

It is not necessary to use a metal-base chip. As an alternative, the base of the chip 201 can be made of glass or sapphire; or silicon or other crystalline material that is used as a base for semiconductor components. However, most other than metallic base materials have a lower mechanical strength, and in many cases also a lower critical temperature that the chip can stand without being damaged by the heat. The process parameters (temperatures, pressing force, handling speed, etc.) need to be carefully selected so that they suit the chip technology that is used. For example, using a silicon-base chip of the kind known at the time of writing this description typically means that the first temperature, to which the chip is heated, is not significantly higher than 200 degrees centigrade; and the first pressing force, with which the chip is pressed against the printed conductive surface, is not significantly larger than 1 megapascal.

Figure 3:
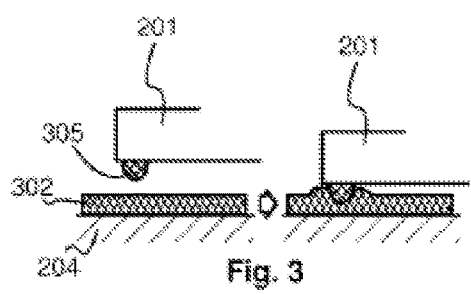
FIG. 3 illustrates a detail related to melting the material of the printed conductive surface.
Figure 4:
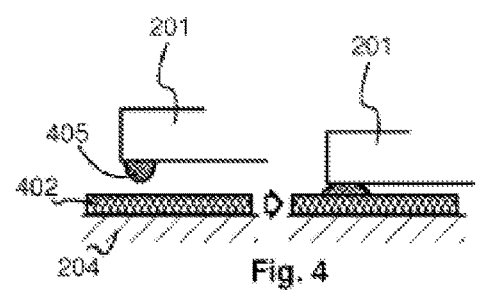
FIG. 4 illustrates a detail related to melting the material of the contact point.

FIGS. 3 and 4 illustrate two basic approaches to making the solder joint between a chip and a conductive pattern. In FIG. 3 we assume that the contact point 305 is made of a conductive material that has a relatively high melting temperature, such as gold, silver, copper, or aluminium. According to an embodiment the melting temperature of the contact point 305 may be the same as with conductive pattern, whereupon both are at least partly melt in the process. The pattern 302 is made of a conductive material that has a relatively low melting temperature, for example of a metallic compound that constitutes or resembles a low-temperature solder. In this case it is essential that a melting temperature (at least under pressure) of the material of the pattern 302 is lower than the highest temperature that the chip 201 (and the substrate 204) can stand without being damaged by the heat. In order to perform the attaching and connecting, the chip 201 is made sufficiently hot so that the temperature of the contact point 305, together with the force pressing the chip 201 against the substrate 204, suffices to locally melt the material of the pattern 302.

In FIG. 4 we assume that the contact point 405 is made of a conductive material that has a relatively low melting temperature, such as a metallic compound that constitutes or resembles a low-temperature solder. According to an embodiment the melting temperature of the contact point 305 may be the same as with conductive pattern, whereupon both are at least partly melt in the process. The pattern 402 is made of a conductive material that has a higher melting temperature than the contact point 405, for example gold, silver, copper, aluminium, or some metallic or non-metallic conductive compound. In this case it is essential that a melting temperature (at least under pressure) of the material of the contact point 405 is lower than the highest temperature that the chip 201 can stand without being damaged by the heat. The substrate 204 does not need to be particularly heat-resistant, because the pattern 402 is between it and the heated chip, and because the heat of the chip can be kept from advancing to the substrate in any excessive amount by selecting the temperatures, forces, time durations, support structure characteristics and/or ambient cooling suitably. In order to perform the attaching and connecting, the chip 201 is made sufficiently hot so that the temperature of the contact point 405, together with the force pressing the chip 201 against the substrate 204, suffices to locally melt the material of the contact point 405.

Cross-breeds between the embodiments of FIGS. 3 and 4 are possible, either so that melting occurs at least partly both in a contact point and in the printed conductive surface it touches, or so that a chip has contact points made of different materials, and it is attached to a number of patterns of different materials on the printed conductive surfaces, so that in some of the contact point—pattern pairs melting occurs in the former, and in others in the latter.

It should be noted that the contact point of a chip is not necessarily bump-formed or protruding to any significant extent. There are chips that have their contact points formed as conductive pads on a surface that otherwise has been oxidized or otherwise made unconductive. Although bump-like contact points may involve advantages in controlling the pressure distribution at the zone where melting is to occur, for the purposes of the present invention it is not important, how the contact points of the chips are formed.

Figure 5:
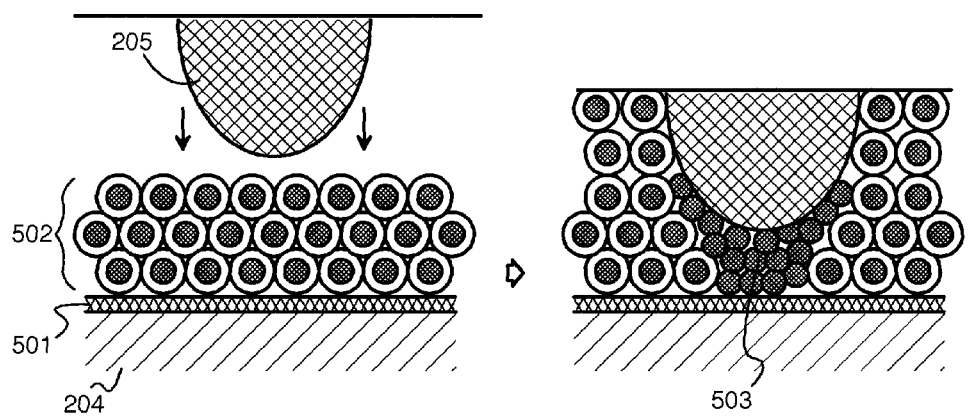
FIG. 5 illustrates a detail related to the use of anisotropically conductive glue.

FIG. 5 illustrates yet another alternative embodiment, in which attaching and connecting a chip to a printed conductive surface is accomplished with the help of anisotropically conductive glue. On a substrate 204 is a printed conductive surface, which comprises a conductive pattern 501 and a layer 502 of anisotropically conductive glue. The last-mentioned originally comprises a large number of conductive particles, typically of the size of 5-50 micrometres in diameter, each enclosed inside an isolating layer or otherwise manufactured so that they do not make conductive connections with each other. Thus prior to application of sufficient heat (typically 75-140 degrees centigrade) the anisotropically conductive glue is actually not conductive at all in any macroscopic sense. The isolating layer and/or a viscous agent mixed with the particles is sticky in order to realize the glueing function.

When a heated contact point 205 of a chip comes into contact with the layer 502 of anisotropically conductive glue, it dissolves, burns, evaporates, or otherwise destroys the isolating layer, or produces another reaction that causes the particles to become macroscopically conductive, in a number of conductive particles in the vicinity. The conductive particles that are affected form an electrically conductive connection 503 between the contact point and the conductive pattern. The glueing function of that part of the anisotropically conductive glue where the isolating layers are still intact (or where some of the viscous agent remains) may be utilized to assist attaching the chip in place. For example, if the layer of anisotropically conductive glue is thick enough compared to the distance to which the contact point protrudes from a surface of the chip, the glueing function may be utilized at parts of the chip that are not adjacent to the contact point. The heat brought along by the chip may be sufficient to melt those conductive particles that constitute the conductive connection, which makes it essentially a solder joint.

In the embodiments of the invention described prior to considering anisotropically conductive glue, limiting the melting to small areas around the contact points was advantageous because it helped to avoid unwanted smearing of other conductive parts of the circuit. Also with anisotropically conductive glue, it is advantageous (if not even essential) to limit the reaction where the particles become to form a macroscopically conductive connection to only small areas around the contact points, but for a slightly different reason. Avoiding the smearing of other inherently conductive parts of the circuit is not such an issue, because anisotropically conductive glue is not macroscopically conductive before the application of sufficient heat. However, it is advantageous to keep it that way, i.e. to keep the layer of anisotropically conductive glue from becoming conductive at those locations where conductivity is not needed. This enables initially spreading the anisotropically conductive glue on the printed conductive surface as a layer that extends continuously between at least two points of the circuit that should not be directly short circuited to each other. The layer of anisotropically conductive glue may even be spread as a continuous layer across the whole printed conductive surface. Applying continuous layers, or at least avoiding the need for very carefully designed, patterned layers, is typically advantageous in printing, because it may eliminate and/or simplify patterning steps from the manufacturing process and thus make it cheaper and technically simpler.

Figure 6:
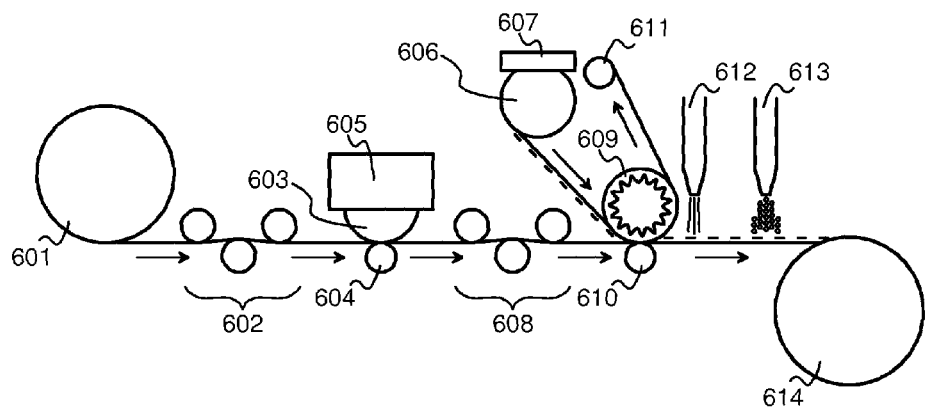
FIG. 6 illustrates an apparatus according to an embodiment of the present invention.

Taken that embodiments of the invention cover a wide range of possibilities, where heat- and pressure-related deformation may take place in any or all of a conductive pattern on a surface, a contact point on a chip, or an intermediate substance such as anisotropically conductive glue, it should be noted that speaking simply of melting may not tell the whole truth. Throughout this description, even at those locations where for reasons of simplicity only the term melting or its derivatives are used, the true meaning is to cover all such phenomena where the deformation and possible change in conductive and/or adhesive properties of materials is achieved through a combination of applied heat and pressure. FIG. 6 illustrates schematically an apparatus for attaching a chip to a printed conductive surface. Here the apparatus has been built as a part of a larger printing process. A substrate web is unrolled from an input roll 601, and fed through an optional tension controller 602 to a nip where the substrate web passes between an impression roll 603 and a corresponding support roll 604. A printing arrangement 605 is configured to interact with the impression roll 603 so that as a result, the impression roll 603 produces a printed conductive surface on the substrate web, typically comprising a number of conductive patterns. Various technologies exist for producing a printed conductive surface on a substrate web, and they are outside the scope of the present invention, so they do not need to be discussed here in more detail. Examples of such technologies are known for example from the PCT publication number WO2009/135985.

Semiconductor chips have been previously manufactured and arranged in a particular pattern, which corresponds to the patterning of said printed conductive surface, on a carrier band. The carrier band is unwound from a carrier band roll 606 at a speed that is synchronized with the propagation speed of the substrate web. An optional flux application arrangement 607 may be provided for applying flux to selected parts (typically the exposed contact points) of the chips on the carrier band. It is also possible that flux has been applied to the contact points of the chips already previously before winding the carrier band on the carrier band roll 606. In some embodiments flux may not be needed at all, but in many cases it is advantageous because it helps to focus the subsequent melting of solder (or particles of anisotropically conductive glue) to the desired locations.

The substrate web with its printed conductive surface, and the carrier band with the chips it carries, are both taken to a nip between a heated roll 609 and a support roll 610. In some embodiments the flux may be applied on the conductive pattern especially to areas where the chip contact points are to be located and/or attached. An optional tension controller 608 is shown to control the tension of the substrate web. The carrier band comes into contact with the heated roll 609 earlier than the substrate web, causing the chips on the carrier band to be heated to a predetermined first temperature, which is lower than what the chips can stand without being damaged by the heat. As an alternative, there could be a separate heating arrangement along the way of the carrier band before it comes into contact with the substrate web. The substrate and/or the conductive pattern may be preheated before the chip attachment. For example an antenna is warm after its printing process, whereafter if the antenna is then still kept warm, it is already preheated for the chip attachment, whereupon the later chip attachment with the antenna is much more easier and faster. In addition the preheated antenna reduces the need of additional heating.

According to an embodiment the printed conductive surface and/or substrate may be preheated for example to temperatures between 25-200 degrees centigrade before attaching the chip to the printed conductive pattern. However, it should be noted that according to an embodiment the chip can also be attached without heating the substrate and/or conductive pattern, whereupon the needed heat energy is transferred by, from or via the chip. The chip may be for example preheated.

In the nip between the heated roll 609 and the support roll 610 the heated chips carried by the carrier band become pressed against the printed conductive surface with a first pressing force. A combination of said first temperature and said first pressing force is sufficient to at least partly melt the material of the printed conductive surface and/or the contact point on a chip. The temporary attachment of the chips to the carrier band is such that the chips become detached from the band web simultaneously when they become attached to the printed conductive surface. The remaining carrier band is collected on a collector roll 611.

The printed conductive surface with the chips attached thereto is optionally cooled with a cooling gas flow from a nozzle 612, and also optionally protected with a layer of protective lacquer sprayed from another nozzle 613 before winding the chip-equipped substrate onto an output roll 614.

Figure 7:
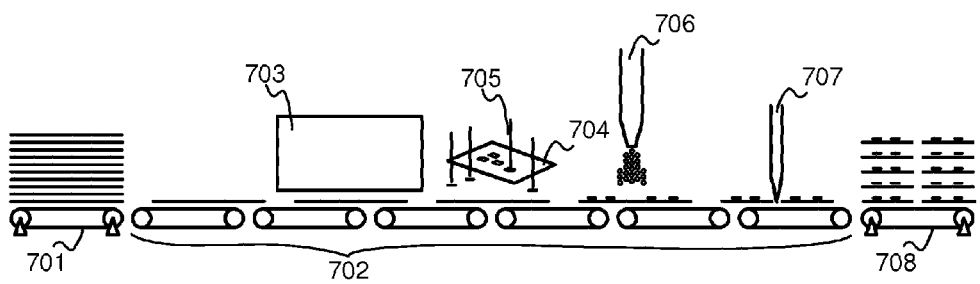
FIG. 7 illustrates an apparatus according to another embodiment of the present invention.

FIG. 7 illustrates schematically another apparatus for attaching a chip to a printed conductive surface. Here the apparatus has again been built as a part of a larger process, which includes printing and other operations for manufacturing a product, such as an intelligent package. Sheets of a substrate material, such as cardboard, are brought to the process on an input tray 701. One sheet at a time is input to the process on a conveyor 702. A printing machine 703, such as a digital printer or an apparatus known from WO2009/135985, is used to form a printed conductive surface on the substrate sheet. The printed conductive surface may comprise for example conductive patterns that are designed to function as parts of electric circuits.

Semiconductor chips have been previously manufactured and brought on a tray 704 or otherwise made available to the process. The apparatus for attaching the chips to the printed conductive surface comprises one or more manipulator arms, of which arm 705 is shown as an example. The apparatus is configured to use a manipulator arm to pick a chip from the tray and to place the chip at a correct location on the printed conductive surface. In accordance with the embodiment of the present invention, a combination of the temperature of the chip and the pressing force used to press it against the printed conductive surface is sufficient to at least partly melt the material of either the printed conductive surface, or a contact point on the chip, or both.

Several approaches are possible for ensuring that the chips are at the appropriate temperature, which is lower than what the chip can stand without being damaged by the heat but high enough to play its part in the melting. The tray 704, a part of the tray, or a holder for the tray (not shown in FIG. 7), may comprise a heater configured to heat at least some of the chips on the tray. Additionally or alternatively the manipulator arm 705 used to transfer the chip from the tray to the printed conductive surface may comprise an integrated heater configured to transfer heat to the picked chip, or there may be a separate heater apparatus or heating zone through which the manipulator arm is configured to take the chip on its way from the tray to the printed conductive surface. Since each chip is typically handled separately (by picking the chips from the tray one by one), this embodiment of the invention allows controlling the temperature and/or pressing force of each chip very accurately. It is even possible to use the very same apparatus to simultaneously (or in close succession) attach and connect chips that require different temperatures, different pressing forces and/or other kind of different handling.

Using a manipulator arm to press the chip against the printed conductive surface involves the additional advantage that the time during which the manipulator arm keeps the chip in place before letting go can be selected relatively freely. Thus the embodiment of FIG. 7 allows using the manipulator arm to keep the chip in place until the melted parts of the printed conductive surface and/or the contact point on the chip have solidified again, which significantly reduces the risk of creeping type alignment errors. Local cooling can be used if necessary to accelerate the cooling, for example in the form of a locally administrated cooling gas jet or a conductive cooling arrangement integrated in the manipulator arm.

The process may include optional additional processing steps, of which the spreading of a protective lacquer with a nozzle 706 and cutting the substrate sheet with a cutting machine 707 are shown in FIG. 7. Other possible additional processing steps include but are not limited to creasing, glueing, bending, and the adding of additional electronics, like an RFID tag. Completed workpieces are collected on an output tray 708.

Figure 8:
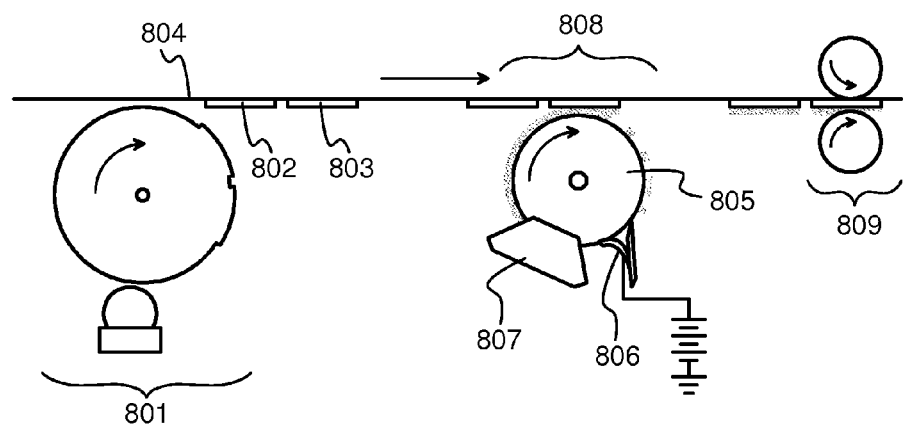
FIG. 8 illustrates a printing section.

In both embodiments of FIGS. 6 and 7 it has been found that a particular way of producing the conductive patterns is very advantageous. FIG. 8 illustrates schematically a printing section, which has been illustrated only schematically as 603, 604, and 605 in FIGS. 6 and 703 in FIG. 7. A first section 801 is configured to print patterns 802 and 803 of an adhesive on the surface of a substrate 804. There may be a dielectric transfer roll 805, and an electric charging apparatus 806 configured to maintain a surface of the dielectric transfer roll 805 at an electrically charged state. A fluidized powderbed or some other kind of particle applicator 807 has been configured to temporarily cover the electrically charged surface of the dielectric transfer roll 805 with a continuous layer of conductive particles. At a section 808 of the printing section the surface of the substrate with the patterns of the adhesive is arranged to come into contact with the continuous layer of conductive particles on the electrically charged surface of the dielectric transfer roll. Electrically conductive particles stick to the adhesive patterns, thus constituting the basis for the conductive patterns and in general the printed conductive surface. The advantageous characteristics of conductivity of the conductive patterns can be enhanced by subsequently cold rolling them like in the nip 809 of FIG. 8, and/or by heating them so that at least partial melting of the conductive particles occurs.

Figure 9:
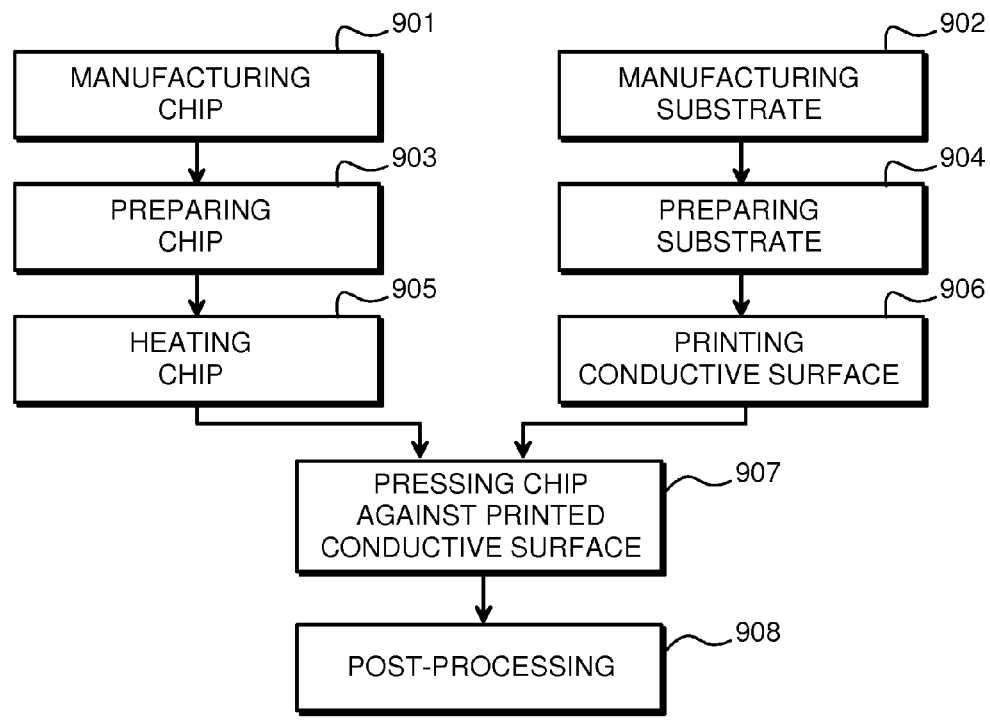
FIG. 9 illustrates a method according to an embodiment of the present invention.

FIG. 9 is a general representation of a method according to an embodiment of the invention. Step 901 represents manufacturing a semiconductor chip; correspondingly step 902 represents manufacturing a substrate which in the completed construction will form the basis on which the combination of a printed conductive surface and the chip attached and connected thereto will appear. Steps 903 and 904 represent preparing the chip and the substrate respectively. For example, preparing the chip at step 903 may comprise placing the chip onto a tray or a carrier band, and possibly also applying flux to selected locations of the chip. Preparing the substrate at step 904 may comprise cleaning the surface of the substrate and/or otherwise ensuring that the surface of the substrate is ready for receiving printed conductive patterns.

Step 905 represents heating the chip to a first temperature, which is lower than what the chip can stand without being damaged by the heat. Correspondingly step 906 represents forming the printed conductive surface, which typically means forming conductive patterns on a surface of the substrate in a printing process. At step 907 the heated chip is pressed against the printed conductive surface with a first pressing force. A combination of said first temperature and said first pressing force is sufficient to at least partly melt the material of the printed conductive surface and/or a contact point on the chip. Step 908 represents post-processing, non-limiting examples of which have been considered in the description of FIGS. 6 and 7.

Figure 10:
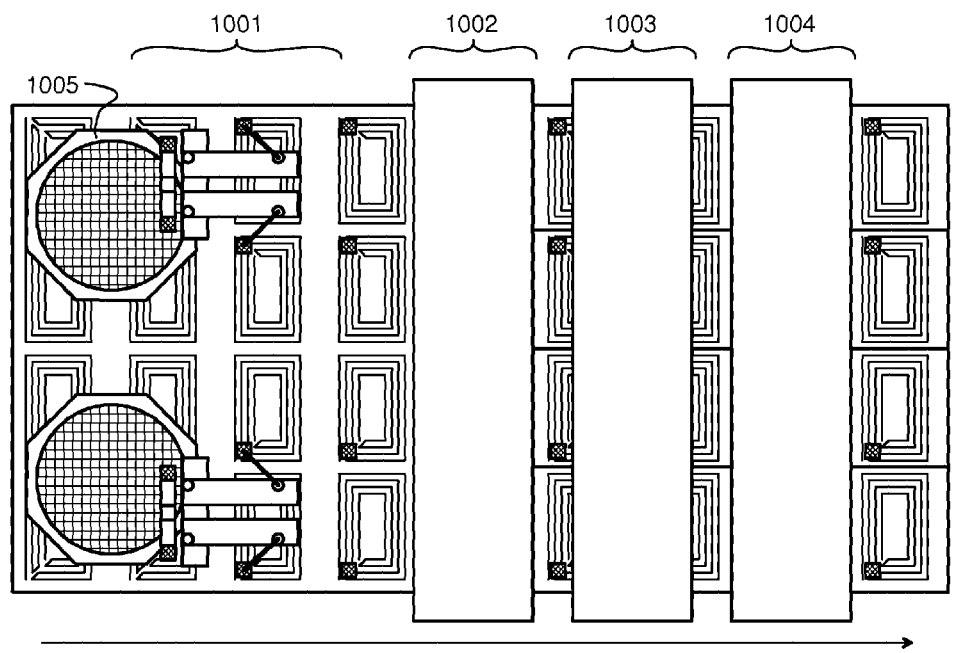
FIG. 10 illustrates an apparatus according to an embodiment of the present invention.

FIG. 10 is a top view of an exemplary apparatus according to an embodiment of the invention. The task of the apparatus is to attach and connect a semiconductor chip to each piece of printed electronics that travels through the apparatus. In this example the pieces of printed electronics are loop-formed antennae, but the same principle is naturally applicable irrespective of what are the exact nature and form of the semiconductor chips and the pieces of printed electronics. In addition to attaching and connecting the chips, the apparatus should post-process the printed electronics to ensure that they are ready for use as e.g. RFID tags.

The main sections of the apparatus is the chip attaching and connecting section 1001, the slitter winder section 1002, the lacquer deposition section 1003 and the testing unit 1004. Of these the three last-mentioned are only very schematically illustrated in FIG. 10, because their operation and detailed implementation are of little importance to the present invention. It suffices to assume that the slitter winder section 1002 is configured to cut a substrate carrying the workpieces into smaller parts for easier further handling, the lacquer deposition section 1003 is configured to spread a layer of protective lacquer on the workpieces, and the testing unit 1004 is configured to test the workpieces for appropriate operation.

Figure 11:
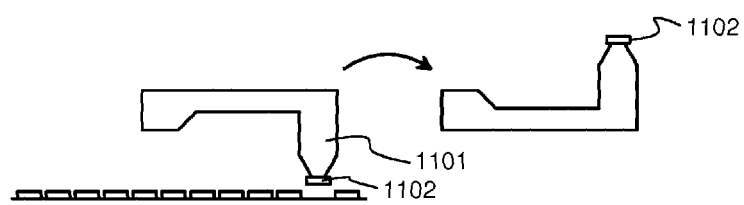
FIG. 11 illustrates a detail of the apparatus of FIG. 10.
Figure 12:
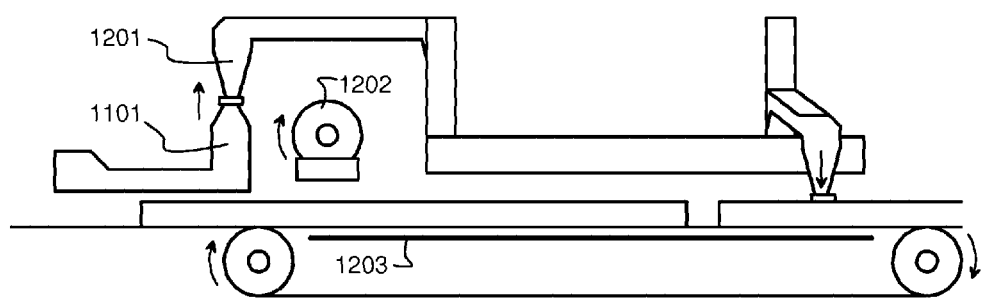
FIG. 12 illustrates another detail of the apparatus of FIG. 10.

The semiconductor chips are brought to the process on a tray, of which tray 1005 is shown as an example. The semiconductor chips may have been manufactured as parts of a silicon wafer, for example a 6 inches or 12 inches wafer, and cut loose to make them ready for picking. Alternatively the step of cutting loose individual semiconductor chips from the wafer may be integrated as a part of the chip attaching and connecting section 1001. FIG. 11 illustrates a principle according to which a so-called pick-flip manipulator 1101 picks a chip 1102 and flips over so that the chip 1102 is offered to a next handling step. FIG. 12 illustrates a principle according to which a place-and-press manipulator 1201 takes the chip offered by the pick-flip manipulator 1101 and applies flux to its desired portions for example by bringing the chip close enough to a rotating flux applicator 1202 in a desired manner. The right part of FIG. 12 illustrates a place-and-press manipulator placing a semiconductor chip at the right location in the piece of printed electronics and pressing it against the printed conductive surface in order to implement the combined attaching and connecting according to an embodiment of the invention.

Previously in this description it has been already pointed out how heating the chip to a first temperature (which is lower than what the chip can stand without being damaged by the heat) can be accomplished in many ways: for example by applying heat through the place-and-press manipulator 1201, and/or through a heater element 1203 below the workpiece, and/or by using a heated gas jet or a radiation heater, which are not shown in FIG. 12. If a heater element is not needed beneath the substrate, element 1203 can be considered to illustrate a back support that supports the substrate and workpieces during the time when the chip is pressed against the printed conductive surface. The place-and-press manipulator implements pressing the heated chip against the printed conductive surface with a first pressing force. A combination of the first temperature and the first pressing force is sufficient to at least partly melt the material of the printed conductive surface and/or a contact point on the chip.

Experiments have been made with an apparatus, the operating principle of which conforms with FIGS. 10 to 12. A first exemplary setup involved a substrate web the width (i.e. the dimension in the direction perpendicular to the arrow indicating propagating direction in FIG. 10) of which was half of that illustrated in FIG. 10. It carried two parallel lines of antennae (instead of the four parallel lines shown in FIG. 10), each line having 16 antennae per metre of length of the substrate. The substrate propagated in the direction illustrated with the arrow in FIG. 10 at a speed of 12 centimetres per second, which equals 7.2 metres per minute.

Chips were brought to the process on a single wafer. The place-and-press manipulators were made movable so that they could keep a chip in place at its desired location on the printed conductive surface for the duration of one second. This was found sufficient to cause the chip to be attached and connected. Due to parallel operation in the two lines, the production rate was 32 units per metre times 7.2 metres per minute, equalling 224 manufactured units per minute or 13440 manufactured units per hour.

A second exemplary setup was otherwise equal with the first, but it involved a substrate web twice as wide, with four parallel lines of antennae, chips on two wafers, as well as two parallel pick-flip manipulator and place-and-press manipulator units, making the configuration identical to that shown in FIG. 10. The production rate was twice that of the first example, equalling 26880 manufactured units per hour.

Image recognition capability would be advantageously built into the apparatus of FIG. 10 in order to enable continuous and accurate position control in placing the chips. One alternative is to have two assembly heads per antenna, one of them performing image recognition while the other picks and places the chip. In the exemplary setups explained above, infrared heating was applied to heat chips that are waiting to be picked. Also the place-and-press manipulators were heated, resulting in a chip temperature between 150 and 180 degrees centigrade at the time of pressing the chip against the printed conductive surface. As an alternative to application of flux through a rotating flux applicator, accurate local injection or spraying of flux was considered. It is considered possible to reduce the time that is required to keep a chip in place at its desired location on the printed conductive surface from one second to 0.3 seconds or even less. The value 0.3 seconds would allow shortening the distance that the place-and-press manipulator moves along with the substrate from 12 centimetres (required above by the propagating speed 12 cm per second) to about 4 centimetres; or alternatively it would allow increasing the propagation speed of the substrate from 12 cm per second to about 36 centimetres per second. The last-mentioned alternative would naturally increase the production rate to three times that mentioned above.

It is not necessary to make the substrate move at all during the time it makes to attach and connect the chip. Buffered operation may be used, so that the substrate is stationary in relation to the chip attaching and connecting mechanism for the short time it takes to attach and connect a chip, and possibly then accelerates to a higher than average speed for a moment so that despite of the stopover, a desired average speed of production is maintained. Buffered operation is generally considered to allow reaching better accuracy, because there are fewer degrees of freedom in the movements that need to be controlled during attaching and connecting a chip.

The temperatures mentioned above were related to a particular selection of the substance used to produce the conductive patterns on the substrate. The mentioned lower limit of 150 degrees could be significantly lowered by selecting for example an alloy of tin, bismuth, and indium, which has a melting point at about 75 degrees centigrade.

Further experiments with the four-antenna wide substrate web suggested that currently plausible web speeds are between 5 and 10 metres per minute, with a substrate web width between 320 and 381 millimetres depending on the antenna design. The temperature to which the chips are heated should be less than 220 degrees centigrade, preferably controlled relatively accurately such as within ±0.3 degrees centigrade. The pressing force that is used to press a chip against the printed conductive surface was between 0.2 and 5 newtons, controlled to the accuracy of ±0.1 newtons. Chips that were considered were RFID chips, some exemplary brands of which are the TI GEN2, HIGGS, MONZA2, and UCODE G2X in the UHF (ultrahigh frequency) range and the MIFARE UL and UCODE G2X in the HF (high frequency) range. The largest considered chip size was 7 mm times 2 mm, but it is believed to be advantageous if the apparatus has small die handling capacity down to 0.3 mm. The associated die thickness was between 0.07 and 0.5 mm, and bump height on the chips was between 10 and 30 micrometres. Using a relatively large chip of 10 square millimetres as an example, a pressing force between 0.2 and 5 newtons means a pressure between 0.02 and 0.5 megapascals.

Assembling accuracy was required to have its so-called 3sigma value smaller than 100 micrometres, and the orientation accuracy was required to be ±30 degrees or lower. The process was suitable for both 6 inches and 12 inches wafers, and it specifically did not use any adhesive, neither conductive nor non-conductive (ACP/NCP; anisotropically conductive paste/non-conductive paste). The protective lacquer was applied after the attaching and connecting of the chips. As substrates, coated paper and cardboard were considered. The testing unit could advantageously be one that is capable of both HF testing and UHF testing.

Figure 13:
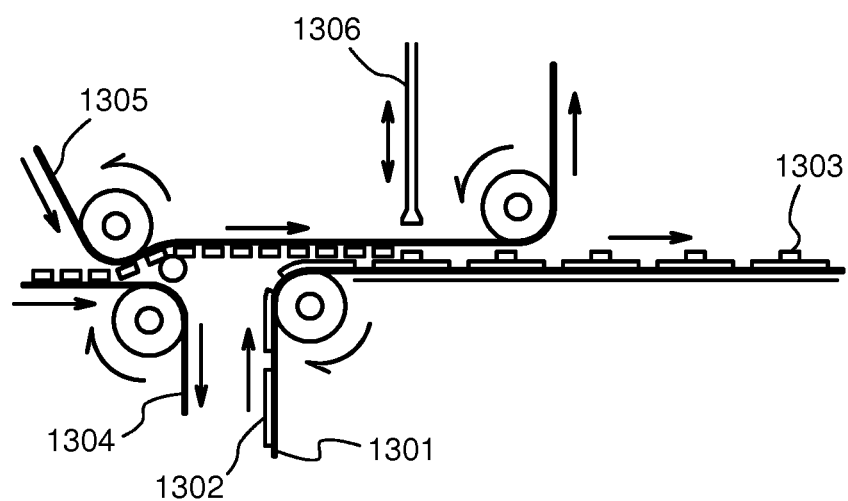
FIG. 13 illustrates an apparatus according to an embodiment of the present invention.

FIG. 13 is a schematic side view of an apparatus according to an embodiment of the invention. A substrate 1301 has at least one printed conductive surface, on which conductive patterns 1302 appear. The task of the apparatus is here to attach and connect one chip to each conductive pattern; chip 1303 is shown as an example. Chips originally come on a dicing membrane 1304, which has a release polymer coating (not separately shown in FIG. 13). The chips are transferred onto a transfer film 1305, the lower surface of which is covered with thermally releasing adhesive. It is also possible to manufacture the whole transfer film of a thermally decomposable material. If chips are originally available on a membrane that has (or the surface adhesive of which has) suitable release properties, it is not necessary to transfer the chips from one membrane to another for the purposes of this process.

The transfer film 1305 brings the chips close to the conductive patterns on the printed conductive surface. Once a chip is properly aligned with a conductive pattern, a heat applicator 1306 "shoots" the chip off the transfer film 1305 by providing some very accurately localized heating. The amount of heat transferred is enough to release the chip from the transfer film and also enough to heat the chip to a first temperature, which is lower than what the chip can stand without being damaged by the heat but high enough to work in favour of attaching and connecting the chip. The heated chip is pressed against the printed conductive surface with a first pressing force either by the heat applicator 1306 or by a separate pressing means (not separately shown in FIG. 13). Yet another possibility is that the speed at which the released chip is shot off the transfer film is high enough to cause the occurrence of a decelerating force when the chip hits the printed conductive surface, so that the decelerating force is simultaneously the pressing force. A combination of said first temperature and said first pressing force is sufficient to at least partly melt the material of the printed conductive surface and/or a contact point on the chip.

The remaining transfer film is removed from the process, and the substrate with its chip-equipped printed conductive surface is taken to further processing steps, which may resemble e.g. those that were described earlier as steps 1002, 1003, and 1004 in FIG. 10. As an alternative, "shooting" chips from the transfer film to the printed conductive surface may be used for only putting the chips in place, after which there would be a separate step in the process that applied the heat and the pressing force that eventually cause the chip to be attached and connected.

Changes and additions can be made to the examples described so far, which means that the examples do not limit the applicability of the appended claims. For example, even if attaching and connecting one chip to one conductive pattern has been considered in many of the examples above, the invention does not limit the numbers of chips and patterns to be attached and connected together. Similarly even if the examples have mainly illustrated bringing the chip onto the printed conductive surface from above, this is not a requirement of the invention but the direction from which the chips are introduced may be chosen according to what suits the process best.

The invention claimed is:

1. A method for attaching a chip to a printed conductive surface, the method comprising:
   forming the printed conductive surface on a substrate by means of printed electronics to establish at least one conductive pattern on the substrate;
   heating the chip to a first temperature, which is lower than what the chip and the substrate can stand without being damaged by the heat; and
   pressing the chip at the first temperature against the at least one conductive pattern established by the printed conductive surface with a first pressing force, wherein a heated roll is configured to transfer heat to the chip during pressing of the chip at the first temperature, and wherein the heated roll presses the chip against the printed conductive surface in a nip between the heated roll and a support roll, wherein a carrier band provides the chip to the nip for disposition on the substrate and wherein the carrier band brings the chip into thermal contact with the heated roll prior to pressing the chip;
   wherein a combination of said first temperature and said first pressing force is sufficient to at least partly locally melt a material of the at least one conductive pattern established by the printed conductive surface.

2. The method according to claim 1, wherein the chip comprises a metal base, and said first pressing force causes a pressure between the chip and the printed conductive surface that is between 0.1 and 10 megapascals.

3. The method according to claim 2, wherein said first temperature is between 75 and 400 degrees centigrade.

4. The method according to claim 3, wherein said first temperature is between 75 and 200 degrees centigrade.

5. The method according to claim 1, wherein the chip comprises a silicon base, and said first pressing force causes a pressure between the chip and the pattern established by the printed conductive surface that is between 0.02 and 0.5 megapascals.

6. The method according to claim 5, further comprising applying flux to selected parts of at least one of the pattern established by the printed conductive surface.

7. The method according to claim 6, wherein the flux is applied to contact points on the chip, and allowed to solidify before pressing the heated chip against the at least one conductive pattern established by the printed conductive surface.

8. The method according to claim 5, further comprising actively controlling an ambient temperature at the location of pressing the heated chip against the at least one conductive pattern established by the printed conductive surface.

9. The method according to claim 1, wherein the printed conductive surface and/or substrate comprising one or more printed conductive surfaces is preheated to temperatures between 25-200 degrees centigrade before attaching the chip to the printed conductive surface.

10. The method according to claim 1, further comprising applying flux to selected parts of at least one of the pattern established by the printed conductive surface.

11. The method according to claim 1, further comprising actively controlling an ambient temperature at the location of pressing the heated chip against the at least one conductive pattern established by the printed conductive surface.

12. An apparatus for attaching a chip to a printed conductive surface, the apparatus comprising:
- a printed conductive surface formed on a substrate by means of printed electronics, wherein the printed conductive surface establishes at least one conductive pattern on the substrate;
- a heater configured to heat a chip to a first temperature, which is lower than what the chip and the substrate can stand without being damaged by the heat; and
- an actuator comprising a heated roll configured to transfer heat to the chip and to press the chip against the printed conductive surface in a nip between the heated roll and a support roll while the chip is at the first temperature with a first pressing force, and a carrier band configured to provide the chip to the nip for disposition on the substrate, wherein the carrier band is configured to bring the chip into thermal contact with the heated roll prior to pressing the chip against the at least one conductive pattern of the printed conductive surface;
- wherein the apparatus is configured to apply said first temperature and said first pressing force in a combination sufficient to at least partly locally melt a material of the at least one pattern established by the printed conductive surface.

13. The apparatus according to claim 12, wherein the actuator further comprises a manipulator arm configured to pick the chip and to place the chip at a predetermined location on the printed conductive surface corresponding to the location of the at least one conductive pattern.

14. The apparatus according to claim 13, wherein at least a part of the heater is configured to heat the chip that is waiting to be picked by the manipulator arm.

15. The apparatus according to claim 13, wherein at least a part of the heater is integrated in the manipulator arm for transferring heat to the chip between picking the chip and placing the chip at said predetermined location on the printed conductive surface corresponding to the location of the at least one conductive pattern.

16. The apparatus according to claim 15, wherein at least the part of the heater is configured to heat the chip that is waiting to be picked by the manipulator arm.

17. An apparatus for attaching a chip to a printed conductive surface, the apparatus comprising:
- a printing section configured to print patterns of an adhesive on a surface of a substrate;
- a dielectric transfer roll;
- an electric charging apparatus configured to maintain a surface of the dielectric transfer roll at an electrically charged state;
- a particle applicator configured to temporarily cover the electrically charged surface of the dielectric transfer roll with a continuous layer of conductive particles;
- a section where the surface of the substrate with the patterns of the adhesive is arranged to come into contact with the continuous layer of conductive particles on the electrically charged surface of the dielectric transfer roll,
- a heater configured to heat the chip to a first temperature, the first temperature being lower than what the chip and the substrate can stand without being damaged by the heat;
- an actuator configured to press the chip against the at least one conductive pattern established by the printed conductive surface while the chip is at the first temperature with a first pressing force, wherein the apparatus is configured to apply said first temperature and said first pressing force in a combination sufficient to at least partly locally melt a material of the at least one conductive pattern established by the printed conductive surface; and
- wherein the apparatus is configured to form the printed conductive surface on the substrate by means of printed electronics, the printed conductive surface establishing at least one conductive pattern on the substrate.

* * * * *